US010425741B2

(12) United States Patent
Rusconi Clerici Beltrami et al.

(10) Patent No.: US 10,425,741 B2
(45) Date of Patent: Sep. 24, 2019

(54) FLEXIBLE MEMS PRINTED CIRCUIT BOARD UNIT AND SOUND TRANSDUCER ASSEMBLY

(71) Applicant: USOUND GMBH, Graz (AT)

(72) Inventors: Andrea Rusconi Clerici Beltrami, Vienna (AT); Ferruccio Bottoni, Graz (AT)

(73) Assignee: USound GmbH, Graz (AT)

( * ) Notice: Subject to any disclaimer, the term of this patent is extended or adjusted under 35 U.S.C. 154(b) by 0 days.

(21) Appl. No.: 15/761,943

(22) PCT Filed: Sep. 29, 2016

(86) PCT No.: PCT/EP2016/073166
§ 371 (c)(1),
(2) Date: Mar. 21, 2018

(87) PCT Pub. No.: WO2017/055384
PCT Pub. Date: Apr. 6, 2017

(65) Prior Publication Data
US 2018/0279053 A1    Sep. 27, 2018

(30) Foreign Application Priority Data

Oct. 1, 2015    (DE) .......................... 10 2015 116 707

(51) Int. Cl.
*B81B 3/00*    (2006.01)
*H04R 17/00*    (2006.01)
(Continued)

(52) U.S. Cl.
CPC .............. *H04R 17/005* (2013.01); *B81B 3/00* (2013.01); *B81B 3/0021* (2013.01); *H04R 17/00* (2013.01);
(Continued)

(58) Field of Classification Search
CPC . H01L 2924/00014; H01L 2224/48091; H01L 2924/00; H01L 2224/45144;
(Continued)

(56) References Cited

U.S. PATENT DOCUMENTS 6,967,362 B2    11/2005    Nam et al.
2003/0094697 A1*    5/2003    Higashida ........... H01L 23/5387
257/758
(Continued)

FOREIGN PATENT DOCUMENTS

CN       203675318 U  *  6/2014
DE    10 2013 114 826 A1    6/2015
(Continued)

OTHER PUBLICATIONS

Translation of the International Preliminary Report on Patentability (PCT/EP2016/073166), dated May 1, 2018.
(Continued)

*Primary Examiner* — Curtis A Kuntz
*Assistant Examiner* — Julie X Dang
(74) *Attorney, Agent, or Firm* — Dority & Manning, P.A.

(57) ABSTRACT

A sound transducer assembly for generating and/or detecting sound waves in the audible wavelength spectrum includes a membrane, a cavity and a MEMS printed circuit board unit. A MEMS printed circuit board unit for a sound transducer assembly for generating and/or detecting sound waves in the audible wavelength spectrum includes a multi-layer piezoelectric structure embedded in a printed circuit board. The printed circuit board includes a membrane, which the multi-layer piezoelectric structure can oscillate or detect oscillations thereof.

20 Claims, 6 Drawing Sheets

(51) Int. Cl.
*H04R 19/02* (2006.01)
*H04R 19/04* (2006.01)

(52) U.S. Cl.
CPC .............. *H04R 19/02* (2013.01); *H04R 19/04* (2013.01); *B81B 2201/0257* (2013.01); *B81B 2203/0127* (2013.01); *B81B 2203/0307* (2013.01); *B81B 2207/07* (2013.01); *H04R 2201/003* (2013.01)

(58) Field of Classification Search
CPC ....... H01L 2924/12042; H01L 2924/14; H01L 2924/181; H01L 41/09; H01L 41/0973; H05K 1/182; H05K 1/189; H05K 2201/042; H05K 2201/055; H05K 2201/0715; H05K 2201/09127; H05K 2201/09145; H05K 2201/09236; H05K 2201/09618; H05K 2201/09981; H05K 2201/10128; H05K 2203/0361; H05K 2203/049
USPC ....... 381/190, 173, 191, 151, 152, 186, 398, 381/405
See application file for complete search history.

(56) References Cited

U.S. PATENT DOCUMENTS

| | | |
|---|---|---|
| 2009/0112071 A1 | 4/2009 | LeBoeuf et al. |
| 2011/0051985 A1* | 3/2011 | Hwang ................ H04R 17/00 381/396 |
| 2011/0085684 A1 | 4/2011 | Kim et al. |
| 2013/0136280 A1* | 5/2013 | Stephanou ............ H04R 17/00 381/190 |
| 2017/0006381 A1 | 1/2017 | Rusconi Clerici et al. |

FOREIGN PATENT DOCUMENTS

| | | |
|---|---|---|
| EP | 1 403 212 A2 | 3/2004 |
| JP | S 57-23597 U | 2/1982 |
| JP | S 58-159598 U | 10/1983 |

OTHER PUBLICATIONS

International Search Report (PCT/EP2016/073166), dated Dec. 8, 2016.
German Search Report (10 2015 116 707.7), dated Jun. 23, 2016.

* cited by examiner

FLEXIBLE MEMS PRINTED CIRCUIT BOARD UNIT AND SOUND TRANSDUCER ASSEMBLY

CROSS-REFERENCE TO RELATED APPLICATIONS

This application claims priority to International Application Serial No. PCT/EP2016/073166, filed Sep. 29, 2016, which claims priority to German Application No. 10 2015 116 707.7, filed Oct. 1, 2015. International Application Serial No. PCT/EP2016/073166 is hereby incorporated herein in its entirety for all purposes by this reference.

FIELD OF THE INVENTION

The present invention relates to a MEMS printed circuit board unit for a sound transducer assembly, in particular a MEMS loudspeaker and/or a MEMS microphone, for generating and/or detecting sound waves in the audible wavelength spectrum, with a printed circuit board and a multi-layer piezoelectric structure, by means of which a membrane provided for this purpose can be set into oscillation and/or oscillations of a membrane can be detected. Furthermore, the invention relates to a sound transducer assembly for generating and/or detecting sound waves in the audible wavelength spectrum with a membrane, a cavity and a MEMS printed circuit board unit, which comprises a printed circuit board and a multi-layer piezoelectric structure, by means of which the membrane can be set into oscillation and/or oscillations of the membrane can be detected.

BACKGROUND

Such sound transducer assemblies are installed, for example, in mobile phones or hearing aids. The term "MEMS" stands for microelectromechanical system. A MEMS sound transducer with a carrier substrate made of silicon, a hollow space formed in the carrier substrate and a multi-layer piezoelectric membrane structure is known, for example, from DE 10 2013 114 826 A1, aka U.S. Patent Application Publication No. 2017-0006381, which is hereby incorporated herein by this reference for all purposes. The hollow space described in this document features at least one opening that is spanned by the multi-layer piezoelectric membrane structure. In its edge area, the membrane structure is connected to the carrier substrate, which consists of silicon, such that, in order to generate and/or detect sound energy, the membrane is capable of oscillating relative to the carrier substrate. A major disadvantage of such silicon-based MEMS sound transducers is the very high manufacturing costs, since silicon (in particular) is very expensive compared to other materials. In addition, the size of the piezoelectric membrane structure, on the one hand, should be as large as possible, in order to be able to generate a high sound pressure. On the other hand, due to the expensive piezoelectric components, the membrane structure should be as small as possible, in order to reduce manufacturing costs. An additional disadvantage is that such a MEMS sound transducer or such a silicon substrate is used in conjunction with a printed circuit board, which together feature a relatively large construction volume. Its field of application is limited, because it can only be installed in devices that provide a correspondingly large installation space.

OBJECTS AND SUMMARY OF THE INVENTION

Thus, the task of the present invention is to provide a MEMS printed circuit board unit and a sound transducer assembly that can be manufactured inexpensively, can generate the largest possible sound pressure and/or is designed to be highly compact.

The task is solved by a MEMS printed circuit board unit and a sound transducer assembly with the characteristics described below.

A MEMS printed circuit board unit for a sound transducer assembly for generating and/or detecting sound waves in the audible wavelength spectrum is proposed. The MEMS printed circuit board unit features a printed circuit board (PCB) and a multi-layer piezoelectric structure, in particular an actuator structure and/or a sensor structure. The structure is designed in such a manner that, by means of it, a membrane provided for this purpose can be set into oscillation and/or oscillations of the membrane can be detected. The piezoelectric structure is preferably formed as a MEMS actuator and/or a MEMS sensor. The structure, in particular a central section of it, is accordingly deflectable along a lifting axis, in order to set into oscillation the membrane provided for this purpose or to detect its oscillations.

In accordance with the invention, the multi-layer piezoelectric structure is directly connected to the printed circuit board, whereas the multi-layer piezoelectric structure is embedded in the printed circuit board. If the structure is embedded in the printed circuit board, at least partial areas or sections of the structure, preferably at least one anchor section, are complete; that is, they are enclosed by the printed circuit board, at least on its upper side and lower side. Thereby, the expensive silicon substrate used in MEMS sound transducers known in the state of the art can be spared. This can greatly reduce the manufacturing costs of the MEMS printed circuit board unit. Furthermore, the embedding in the printed circuit board protects the sensitive multi-layer piezoelectric structure from external influences. So that the structure can continue to be deflected along the lifting axis in order to interact with the membrane provided for this purpose, the printed circuit board is also designed to be flexible. By the fact that the printed circuit board can be used directly to suspend the structure, the MEMS printed circuit board unit can be formed to be highly compact. Thus, an additional component previously used in the state of the art, in particular the silicon frame, can be spared, such that the height of the MEMS printed circuit board unit (in particular) can be greatly reduced.

In order to realize a flexible design of the printed circuit board, it is advantageous if the use of fiber composite materials is dispensed with. Instead, the base body of the printed circuit board is preferably formed by a polymer material, in particular one that is flexible. The use of polymers ensures a corresponding flexible design of the printed circuit board. Furthermore, with polymers, the cost is lower compared to silicon, such that a cost-reduced manufacturing of the MEMS printed circuit board unit can be achieved. Moreover, the manufacturing process of such a flexible or pliable printed circuit board—with which a multiple number of layers (in particular at least one piezo layer, one support layer, one electrode layer and/or one multiple number of polymer layers forming the base body of the printed circuit board) are interconnected by means of lamination—is significantly cheaper in comparison to previously known manufacturing processes.

It is advantageous if the structure comprises at least one piezoelectric layer, which is referred to below as a piezo layer. This may comprise a MEMS actuator layer and/or a MEMS sensor layer. In the alternative or additionally, the structure comprises at least one electrode layer. Likewise, the structure may comprise a support layer that provides the structure with the necessary strength, in order to deflect along the lifting axis without damage.

It is advantageous if the multi-layer structure features two piezoelectric layers. Each of these is preferably arranged between two electrode layers. At this, one of the electrode layers, in particular four electrode layers, may be formed by the support layer. The support layer is preferably made of a metal, in particular copper. If the structure features multiple piezoelectric layers, the structure can generate more force and bring about greater deflection. In this connection, it is additionally advantageous if the structure features more than two piezoelectric layers.

It is advantageous if a piezoelectric layer of the structure is designed as a sensor and another piezoelectric layer is designed as an actuator. Alternatively, a piezoelectric layer may also comprise a multiple number of separate sections, of which one section is designed as a sensor and another section is designed as an actuator.

As already mentioned above, the multi-layer structure is integrated in the printed circuit board. In addition, it is advantageous if a control unit, in particular an ASIC, is integrated in the printed circuit board. An ASIC is an electronic application-specific integrated circuit that is suitable for operating the sound transducer assembly. In the alternative or additionally, it is likewise advantageous to integrate at least one additional passive electronic component in the printed circuit board. Additional electrical components (in particular, additional passive components) can be, for example, electrical resistors and/or I/O contacts. Thereby, the construction volume of the MEMS printed circuit board unit can be very well exploited, by which the MEMS printed circuit board unit in turn can be formed to be highly compact.

It is advantageous if the printed circuit board is manufactured, in particular by means of lamination, from a multiple number of layers, in particular a multiple number of polymer layers and/or metal layers. By means of a multi-layered design of the printed circuit board, components, in particular the structure, the ASIC and/or at least one additional passive component, can be easily and cost-effectively integrated, embedded and/or completely encapsulated in the printed circuit board.

It is likewise advantageous if, as already mentioned above, the multi-layer piezoelectric structure features at least one support layer. Preferably, the support layer of the structure is formed by a layer of the printed circuit board. Thus, such layer is a component of both the printed circuit board and the structure. The support layer is preferably made of a metal, in particular copper, and/or preferably features a thickness of between 2 to 50 µm. The support layer may be electrically coupled to the piezo layer, in particular by means of a conductive adhesive. In such a case, the support layer may form as an electrode layer for driving the piezo layer, or act as such. However, alternatively, the support layer can also be electrically decoupled from the piezo layer, in particular by means of an insulating layer arranged between such two.

It is advantageous if the structure features a multiple number of piezo layers. The piezo layers can be designed such that each of them can be excited by means of a lower and/or upper electrode layer. Furthermore, it is conceivable that one of the piezo layers is electrically coupled to the support layer and accordingly acts as an electrode layer. By means of such a coupling, the support layer can be arranged directly on the piezoelectric layer. Alternatively, the piezo layer is located between two electrode layers and/or is electrically decoupled from the support layer by means of an insulating layer.

It is advantageous if the structure can be deflected relative to an anchor section of the printed circuit board along the lifting axis and/or is connected to a fastening section through at least one flexible connecting element. A coupling element can be arranged in the fastening section of the structure. By means of the coupling element, the membrane provided for this purpose and the structure are mechanically connected to each other. Upon the electrical excitation of the structure, the coupling element consequently oscillates together with the membrane and the structure along the lifting axis. Advantageously, the membrane and the structure can be optimized by this spatial decoupling in a manner essentially independent of each other, in particular geometrically with respect to their respective size, without this having a negative effect on the properties of the other component. Accordingly, for example, the structure can be made smaller in comparison to the membrane, by which the material costs can be reduced. At the same time, the membrane can be made larger in size compared to the structure, by which, in turn, performance—i.e., acoustic performance capability—can be increased.

In order to realize an electrical connection of the MEMS printed circuit board unit with a second component of the sound transducer assembly, in particular with a rigid second printed circuit board unit, it is advantageous if the printed circuit board features at least one electrical contact. By means of such an internal contact, in particular an inner contact, the MEMS printed circuit board unit, in particular the metallic support layer and/or at least one electrode layer, can be connected to the rigid second printed circuit board unit, in particular with electronic active and/or passive components embedded therein.

It is likewise advantageous if the printed circuit board features at least one external contact for electrically connecting the MEMS printed circuit board unit to an external device. Accordingly, the external contact forms the interface to a component of a main device, in particular a hearing aid and/or a mobile phone.

It is advantageous if the printed circuit board comprises woven contact paths that lead from the structure to an electrical contact, in particular to an external contact. Preferably, only woven contact paths are arranged in the kinking/bending section; that is, in particular not the structure.

It is advantageous if the MEMS printed circuit board unit features a contact section, a kinking and/or bending section and/or a main section. The main section preferably comprises the structure, the at least one flexible connecting element and/or the fastening section. The contact section preferably comprises at least one external contact. The kinking/bending section is preferably arranged between the main section and the contact section and/or is designed to be more elastic than the main section. Furthermore, the MEMS printed circuit board unit in this can preferably be bent by up to 90°. Such an elastic formation of the kinking/bending section can be ensured if only woven, flexible contact paths are arranged in the kinking/bending section, and/or the structure does not extend from the main section into the kinking/bending section. Through correspondingly kinking over and/or bending over of the contact section, the external contacts accordingly can also be arranged laterally on the MEMS printed circuit board unit.

In order to achieve flexibility of the MEMS printed circuit board unit, it is advantageous if a polymer is used as base material for the printed circuit board. In addition, the printed circuit board and/or the printed circuit board comprises the aforementioned metallic support layer and/or the woven elastic contact paths, in particular made of woven carbon fibers or of woven metal paths. Such elastic contacting of the electrodes of the sound transducer assembly improves the fatigue properties. Likewise, by means of the use of woven contact paths, it can be ensured that the MEMS printed circuit board unit remains elastic and features a long service life. Furthermore, a large maximum bending angle can thus be achieved, in particular in the kinking/bending section.

Furthermore, it is advantageous if the MEMS printed circuit board unit, in particular the printed circuit board and/or the structure, features at least one slot. The at least one slot is preferably designed in such a manner that the structure, the at least one flexible connecting element and/or the fastening section are cut free, in particular in their respective edge areas.

The structure preferably features a cantilever or is formed as such. This is preferably fixed at one end, whereas its other end can be deflected from a neutral position along the lifting axis. By means of an aforementioned free cutting of the structure and/or the printed circuit board, for deflecting the structure, it is advantageous that a lower force must be expended. Furthermore, the structure can thereby be deflected more strongly, since the deflection is not hindered by the base material of the printed circuit board, in particular by the polymer. Thereby, the maximum lift of the membrane and thus also the maximum sound pressure can be increased.

As an alternative to the free cut, however, it is also advantageous if the MEMS printed circuit board unit, in particular the printed circuit board, is formed as a completely closed body. By means of such a design, protection of the integrated components against environmental influences is ensured. Furthermore, as a result, manufacturing costs can be reduced, since process steps for the formation of the free cut can be spared.

A sound transducer assembly, in particular a MEMS loudspeaker, a MEMS microphone and/or a MEMS receiver, for generating and/or detecting sound waves in the audible wavelength spectrum, which features a membrane and a MEMS printed circuit board unit, is also proposed. Preferably, the sound transducer assembly further comprises a cavity. The term "cavity" is to be understood as a preferably closed hollow space, which adjoins one side of the membrane and by means of which the sound pressure can be amplified. The MEMS printed circuit board unit comprises a printed circuit board and a multi-layer piezoelectric structure, by means of which the membrane can be set into oscillation along a lifting axis, and/or oscillations of the membrane can be detected. The MEMS printed circuit board unit is designed according to the preceding description, whereas the specified characteristics may be present individually or in any combination. As a result, the printed circuit board unit can be manufactured to be highly compact and cost-effective. Furthermore, the moving sensitive components, in particular the structure, are protected against external influences.

It is advantageous if the sound transducer assembly comprises a second printed circuit board unit connected to the flexible first MEMS printed circuit board unit, which second printed circuit board unit is preferably formed to be rigid and/or at least one electronic component is integrated (in particular, completely embedded and/or encapsulated) in it. The second printed circuit board unit preferably forms the support frame for the flexible first MEMS printed circuit board unit with its piezoelectric structure embedded therein. The second rigid printed circuit board unit, in particular its base body, is preferably made of a fiber composite material.

It is advantageous if the second rigid printed circuit board unit features a gap, preferably at least partially forming the cavity, at the opening of which the first flexible MEMS printed circuit board unit is arranged. As a result, the flexible MEMS printed circuit board unit, in particular its embedded structure, can oscillate along the lifting axis relative to the second printed circuit board unit acting as a support frame.

Furthermore, it is advantageous if the gap extends completely through the second rigid printed circuit board unit or printed circuit board, and/or if a housing part is arranged in the area of a second opening of the gap for forming a closed cavity. As a result, the sound transducer assembly can be formed to be highly compact and cost-effective.

In order to reduce manufacturing costs, it is advantageous if the sound transducer assembly comprises a membrane module, which comprises the membrane and/or a membrane frame holding it in its edge area.

Furthermore, it is advantageous if the flexible first MEMS printed circuit board unit is arranged on the side of the rigid second printed circuit board unit turned towards or turned away from the membrane module. As a result, for example, the cavity size can be adapted rapidly and easily during the manufacturing process.

In order to be able to adapt the structure and the membrane to their respective individual requirements, it is advantageous if the membrane is connected through a coupling element to the flexible first MEMS printed circuit board unit, in particular in its fastening section. The material of the coupling element preferably differs from that of the flexible first printed circuit board.

Preferably, a housing of the sound transducer assembly is formed by the membrane frame, the second rigid printed circuit board unit and/or the housing part closing the cavity.

In order to be able to avoid an acoustic excitation of the housing part, it is advantageous if the housing is formed from a different material compared to the printed circuit board, in particular a metal, a ceramic and/or a plastic.

It is advantageous if the first flexible MEMS printed circuit board unit is electrically coupled to the rigid second printed circuit board unit, in particular by means of a conductive adhesive. The second rigid printed circuit board unit preferably features electrical contacts, as a result of which the electrical contacting of the first and the second printed circuit board units can take place.

It is advantageous if at least one electronic component, such as an ASIC, is integrated (in particular, completely encapsulated) in the second rigid printed circuit board. In the alternative or additionally, at least one additional passive component can be integrated in the second printed circuit board. Through the arrangement of a second printed circuit board unit directly on the first MEMS printed circuit board unit, no additional support frame is necessary, by which a compact design can be realized.

It is advantageous if the ASIC, a sensor formed by the structure and an actuator formed by the structure are designed as a closed control loop.

BRIEF DESCRIPTION OF THE DRAWINGS

Further advantages of the invention are described in the following embodiments. The following is shown.

DETAILED DESCRIPTION

In the following description of the figures, in order to define the relationships between the various elements, with reference to the locations of objects shown in the figures, relative terms, such as above, below, up, down, over, under, left, right, vertical and horizontal are used. It is self-evident that such a term may change in the event of a deviation from the location of a device and/or element shown in the figures. Accordingly, for example, in the case of an orientation of a device and/or an element shown inverted with reference to the figures, a characteristic that has been specified as "above" in the following description of the figures would now be arranged "below." Thus, the relative terms are used solely for a more simple description of the relative relationships between the individual devices and/or elements described below.

Figure 1:
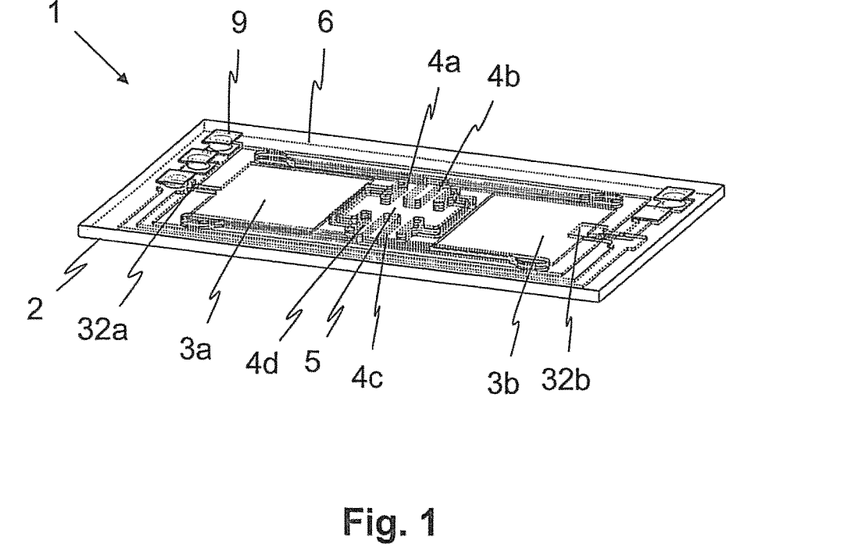
FIG. 1 a MEMS printed circuit board unit in a perspective view with a completely closed and/or polymeric base body, FIG. 2 a second embodiment of a MEMS printed circuit board unit in a perspective view with a contact section, a kinking/bending section and a main section, FIG. 3 a third embodiment of a MEMS printed circuit board unit in a perspective view with which the moving components, in particular a structure, a connecting element and/or a fastening section, are cut free, FIG. 4 a sectional view of the MEMS printed circuit board unit shown in FIG. 3, FIG. 5 a first embodiment of a sound transducer assembly in a perspective view with a first MEMS printed circuit board unit arranged between a membrane module and a second rigid printed circuit board unit, FIG. 6 a sectional view of the first embodiment of the sound transducer assembly shown in FIG. 5, FIG. 7 a second embodiment of the sound transducer assembly in a perspective view with a rigid second printed circuit board unit arranged between the membrane module and the first flexible MEMS printed circuit board unit, FIG. 8 a sectional view of the second embodiment of the sound transducer assembly shown in FIG. 7, FIG. 9 a third embodiment of the sound transducer assembly in a sectional view, which features the first MEMS printed circuit board unit shown in FIG. 2, FIG. 10 a fourth embodiment of the sound transducer assembly in a sectional view, with a plastic element that comprises electrical cables, FIG. 11 a sectional view of a multi-layer piezoelectric structure according to a first embodiment with an insulating layer located between a support layer and an electrode layer and FIG. 12 a sectional view of the multi-layer piezoelectric structure according to a second embodiment with a support layer formed as an electrode layer.

FIG. 1 shows a MEMS printed circuit board unit 1 in a perspective view. The MEMS printed circuit board unit 1 comprises a printed circuit board 2, which is formed as a completely closed body. Furthermore, the MEMS printed circuit board unit 1 comprises electrical contacts 9, of which only one is provided with a reference sign. The electrical contacts 9 are located on the upper side of the printed circuit board 2 in accordance with the presentation, and serve to connect the MEMS printed circuit board unit 1 to a second printed circuit board unit 16, which is shown for example in FIGS. 5 and 7.

Figure 11:
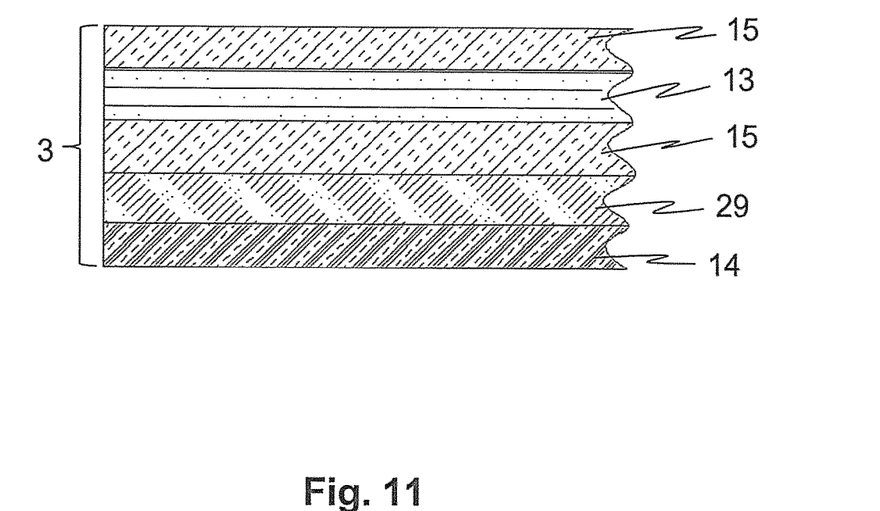
Figure 12:
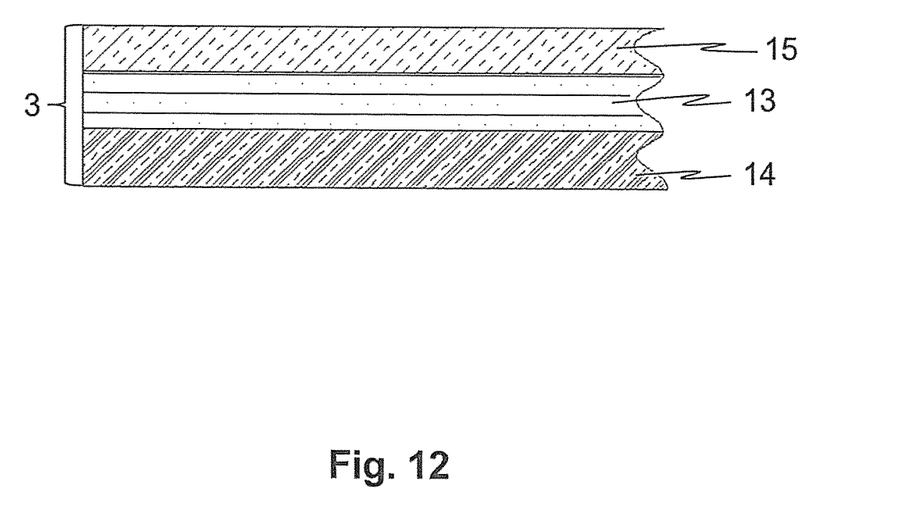

Furthermore, the MEMS printed circuit board unit 1 comprises a multi-layer piezoelectric structure 3. In the case of a MEMS microphone, this acts as a sensor structure and/or, in the case of a MEMS loudspeaker, it acts as an actuator structure. A detailed sectional view of the piezoelectric structure 3 is shown in FIGS. 11 and 12 according to two different embodiments.

As shown in FIG. 1, the piezoelectric structure 3, a multiple number of flexible connecting elements 4a, 4b, 4c, 4d and/or a fastening section 5 are completely encapsulated in the printed circuit board 2. The piezoelectric structure 3 is preferably formed as a MEMS actuator. The MEMS printed circuit board unit 1 is made of a polymer, such that it can be flexibly designed. Furthermore, the MEMS printed circuit board unit 1 comprises flexible, in particular woven, contact paths 6, of which only one is provided with a reference sign in the figures, for reasons of clarity.

The MEMS printed circuit board unit 1 features at least one anchor section 32a, 32b. In contrast to this, the structure 3a, 3b formed as a cantilever can be deflected along a lifting axis. In the present case, the MEMS printed circuit board unit 1 according to FIG. 1 features two such structures 3a, 3b. Each of these is coupled to the fastening section 5 by means of two flexible and/or elastic connecting elements 4a-4d.

If the structure 3 is embedded in the printed circuit board 2, at least partial areas or sections of the structure 3, preferably at least the associated anchor section 32, are enclosed by the printed circuit board 2 completely; that is, at least on its upper side and lower side. Thereby, the expensive silicon substrate customarily used in MEMS sound transducers known in the state of the art can be spared. This can greatly reduce the manufacturing costs of the MEMS printed circuit board unit 1. Furthermore, the embedding in the printed circuit board 2 protects the sensitive multi-layer piezoelectric structure 3a, 3b from external influences. So that the structure 3a, 3b can continue to be deflected along the lifting axis in order to interact with the membrane 22 shown in FIG. 5, for example, the printed circuit board 2 is also designed to be flexible. By the fact that the printed circuit board 2 is used directly to suspend the structure 3a, 3b, the MEMS printed circuit board unit 1 can be formed to be highly compact.

Figure 2:
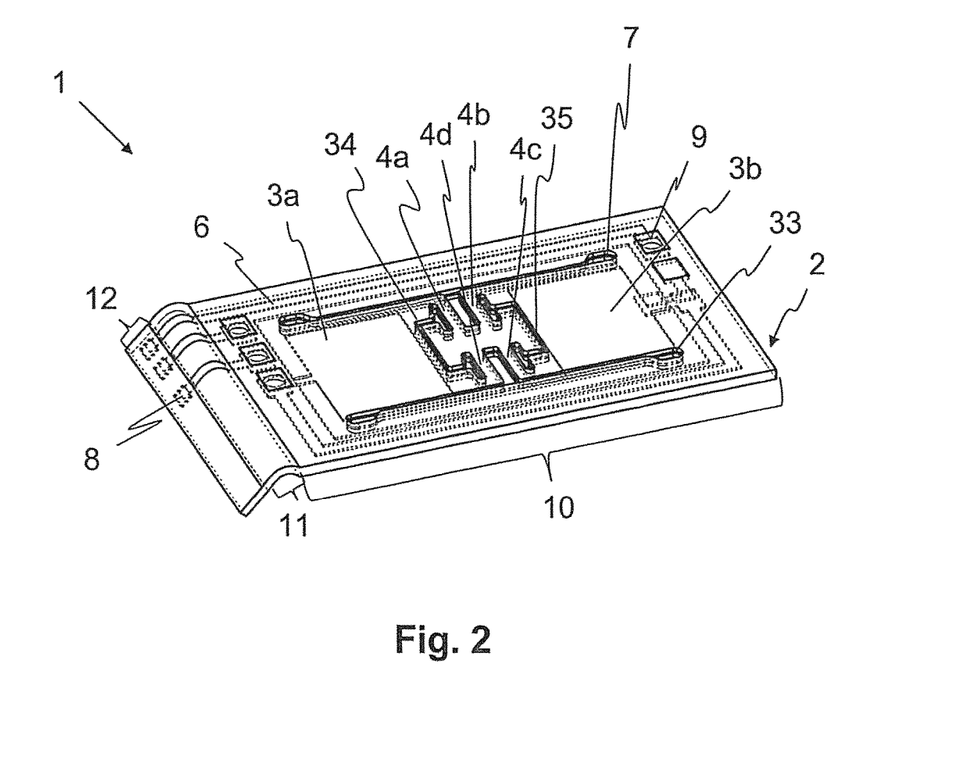
Figure 3:
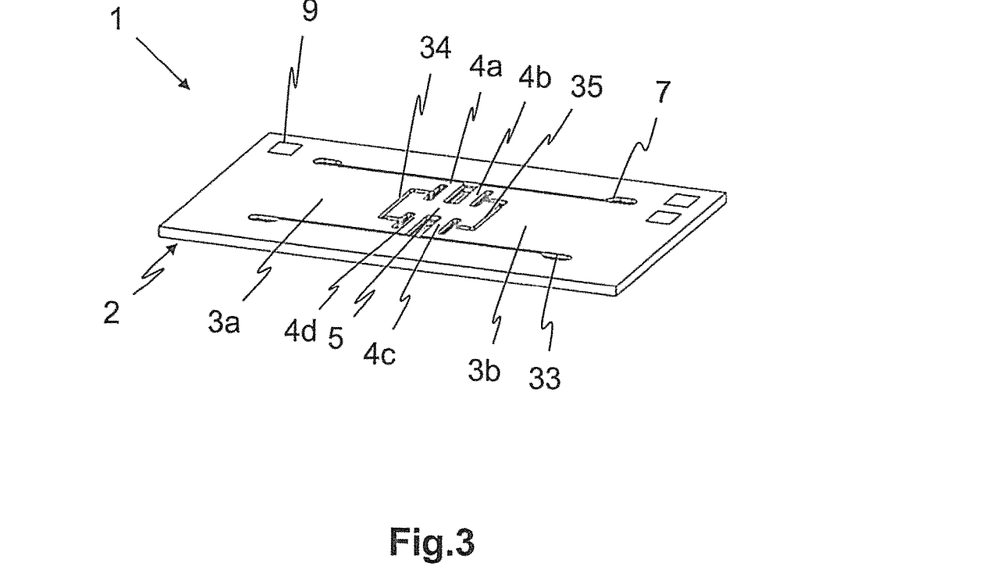

Two additional embodiments of the MEMS printed circuit board unit 1 are shown in FIGS. 2 and 3, whereas each essentially addresses the differences with respect to the embodiment already described. Thus, with the following description, the additional embodiments for the same characteristics use the same reference signs. Unless they are once again explained in detail, their design and mode of action correspond to the features already described above. The differences described below can be combined with the features of the respective preceding and following embodiments.

The MEMS printed circuit board unit 1 shown in FIG. 2 comprises three sections or partial areas, namely a main section 10, a kinking/bending section 11 and a contact section 12. The main section 10 comprises the electrical contacts 9 located on one side of the printed circuit board 2, of which only one is provided with a reference sign, for reasons of clarity. These are intended to electrically connect the MEMS printed circuit board unit 1 according to FIG. 9 to a second printed circuit board unit 16.

The structure 3a, 3b of the MEMS printed circuit board unit 1 is at least partially cut free according to the embodiment shown in FIG. 2 (the same applies to the embodiment shown in FIG. 3). For this purpose, the printed circuit board 2 features at least one slot 7, 33, 34, 35 that is continuous—that is, extending from the upper side to the lower side. By means of this, the structure 3a, 3b is at least partially cut free in its edge area. In the present case, the printed circuit board 2 comprises a first slot 7 and a second slot 33 that laterally cut free the structure 3a, 3b, the connecting elements 4a-4d and/or the fastening section 5 with respect to the part of the printed circuit board 2 acting as a support frame. Furthermore, the printed circuit board 2 comprises a third and/or fourth slot 34, 35. By means of this, the respective structure 3*a*, 3*b* is cut free with respect to the allocated connecting elements 4*a*-4*d* and/or the fastening section 5. The same applies to the embodiment shown in FIGS. 3 and 4.

Thus, the structure 3*a*, 3*b*, the at least one flexible connecting element 4*a*-4*d* and the fastening section 5 are cut free from each other and from the support frame of the printed circuit board 2. The slots 7, 33, 34, 35 enable a force-reduced deflection of the fastening section 5. Furthermore, this can be used to generate a larger lift. By contrast, the woven contact paths 6 are integrated in the PCB 2 completely; that is, from all sides.

The second partial section, which is configured as a kinking/bending section 11, is located between the contact section 12 and the main section 10. The third partial section, namely the contact section 12, features at least one external contact 8 for electrically connecting the MEMS printed circuit board unit 1 to an external device (not shown in the figures). The kinking/bending section 11 is designed to be more elastic than the main section 10, such that preferably a kink of up to 90° is possible. As a result, the external contacts 8 can be arranged from the side on a housing according to the embodiment shown in FIG. 9. In order to be able to ensure sufficient flexibility of the kinking/bending section 11, exclusively woven contact paths 6 are located in this. The structure 3 does not extend into these.

Figure 4:
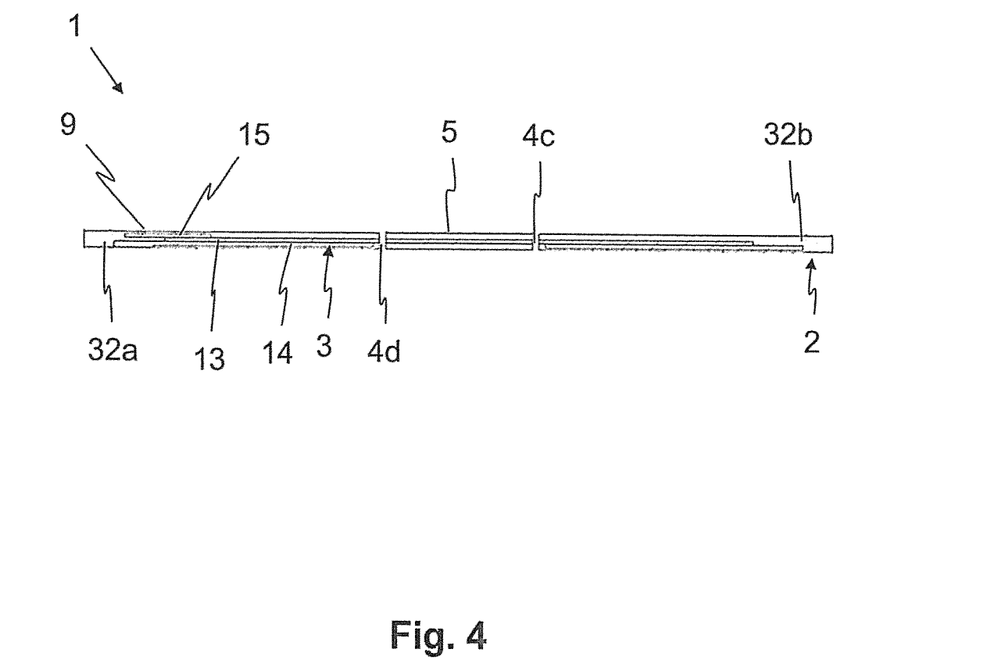

FIGS. 3 and 4 show an additional embodiment of the MEMS printed circuit board unit 1. In this case, the structure 3*a*, 3*b*, the connecting elements 4*a*-4*d* and/or the fastening section 5 are cut free from each other and/or from the printed circuit board frame, in particular by means of at least one of the slots 7, 33, 34, 35. The printed circuit board 2 features electrical contacts 9 only on one side, the upper side in accordance with the depiction.

FIG. 4 shows a sectional view of the MEMS printed circuit board unit 1 described above, which comprises the printed circuit board 2 and the multi-layer piezoelectric structure 3. According to FIG. 4, the structure 3 features a piezo layer 13, a support layer 14 (in particular, a metallic support layer 14) and/or at least one electrode layer 15. According to the present embodiment, the support layer 14 is formed as an electrode layer 15 and is electrically coupled directly to the piezo layer 13. The fastening section 5, in which a coupling element 21 can be fastened (compare, for example, FIG. 6), is located at the center. The support layer 14 preferably extends at least partially into the anchor section 32. Furthermore, the support layer 14 preferably extends over the entire area of the cantilever 3*a*, 3*b*, the connecting elements 4*a*-4*d* and/or the fastening section 5. By contrast, the piezo layer 13 is preferably limited to the section of the cantilever 3*a*, 3*b*.

Figure 5:
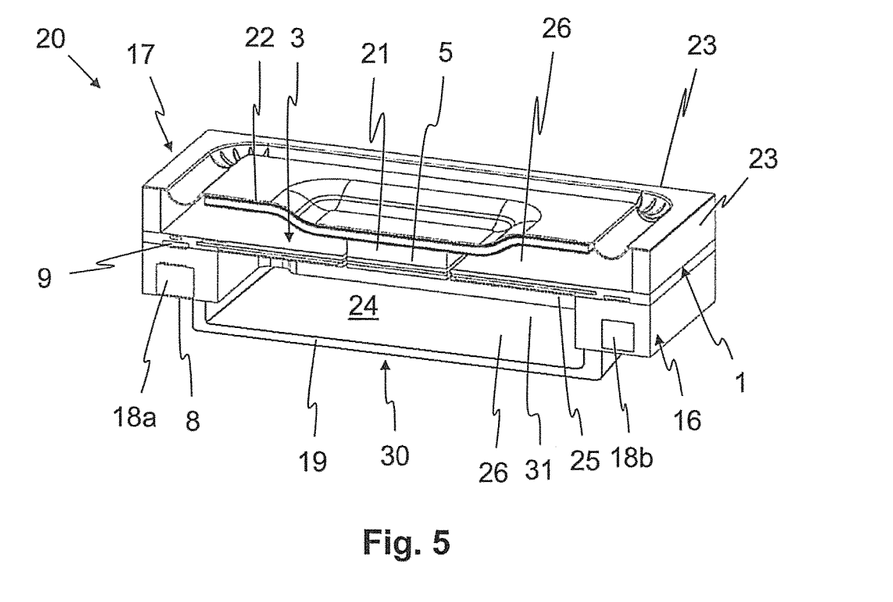
Figure 6:
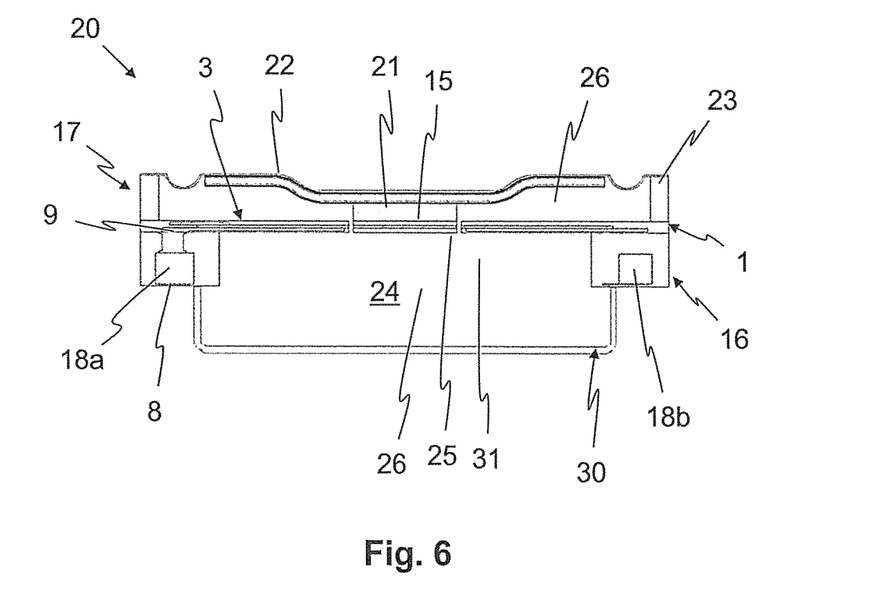

FIGS. 5 and 6 show a first embodiment of a sound transducer assembly 20. The sound transducer assembly 20 features a housing 30, which is formed from a membrane frame 23 of a membrane module 17, the MEMS printed circuit board unit 1 (which is formed, in particular, according to one of the two embodiments shown in FIG. 1 or 3), a second printed circuit board unit 16 and/or a housing part 19.

In contrast to the MEMS printed circuit board unit 1, the second printed circuit board unit 16 is formed to be rigid, and not flexible. For this purpose, the base body of the second printed circuit board unit 16 is preferably formed from a fiber composite material. The second printed circuit board unit 16 comprises a gap 31. This is formed to be continuous and extends from a first end side to an opposite second end side of the second printed circuit board unit 16. Accordingly, the gap 31 comprises two opposing openings 25, 26. The housing part 19 is arranged in the area of one of such two openings 26. Accordingly, the housing part 19 closes off the gap 31 at one side, by which a cavity 24 is formed.

The flexible MEMS printed circuit board unit 1 is arranged at the other opening 25 opposite the gap 31. For this purpose, the MEMS printed circuit board unit 1 is attached to the front side of the rigid second printed circuit board unit 16. Accordingly, the rigid second printed circuit board unit 16 forms a rigid support frame for the flexible MEMS printed circuit board unit 1, with respect to which the structure 3 can deflect the fastening section 5 together with the coupling element 21 along the lifting axis.

As already mentioned above, the first MEMS printed circuit board unit 1 is arranged at the first opening 25 of the gap 31 and the housing part 19 is arranged at the second opening 26. The housing part 19 closes the gap 31 on the side of the second opening 26, such that the volume of the cavity 24 is defined by the gap 31 and the partial hollow space formed by the housing part 19.

According to the embodiment shown in FIGS. 5 and 6, the MEMS printed circuit board unit 1 is arranged between the membrane module 17 and the rigid second printed circuit board unit 16. The second printed circuit board unit 16 is connected to the first MEMS printed circuit board unit 1 by means of electrical contacts 9. According to the present embodiment, the external contacts 8 of the sound transducer assembly 20 are arranged on the second printed circuit board unit 16, in particular outside the cavity 24 and/or on its side turned away from the MEMS printed circuit board unit 16.

According to the present embodiment, at least one electronic component 18*a*, 18*b* is integrated in the second printed circuit board unit 16.

The membrane module 17 comprises, in addition to the membrane frame 23, the membrane 22. This is accommodated in the membrane frame 23 in its edge area in the z-direction or along the lifting axis in an oscillating manner. When the structure 3 is electrically excited, the coupling element 21, together with the membrane 22, begins to oscillate relative to the second printed circuit board unit 16.

Figure 7:
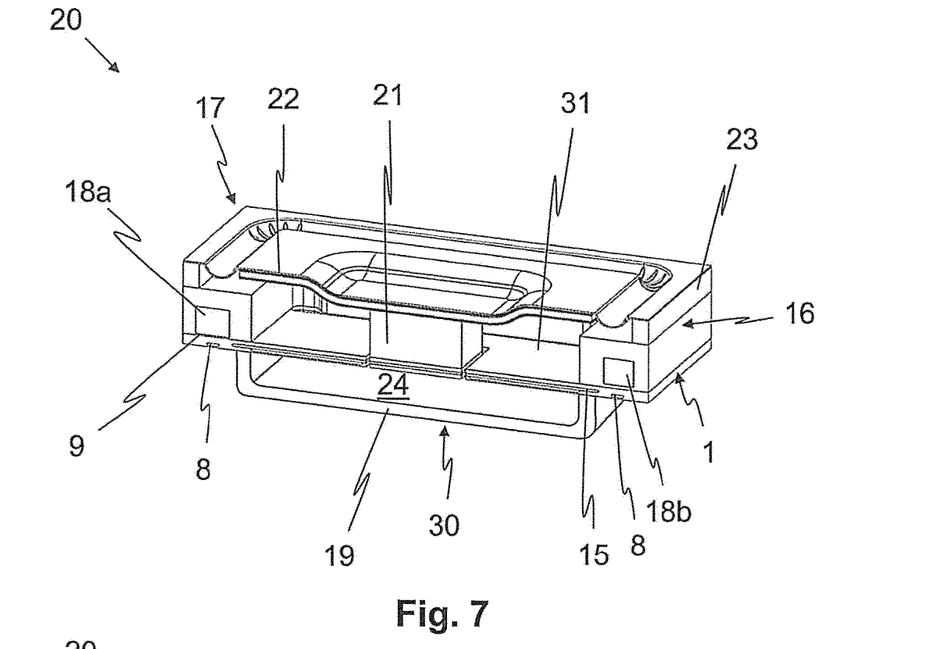
Figure 9:
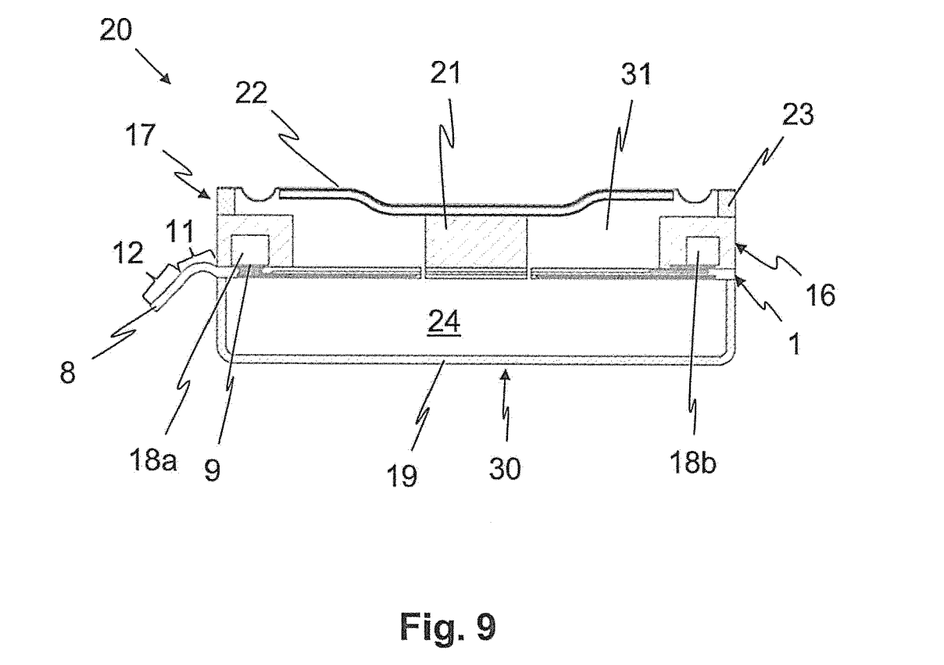
Figure 10:
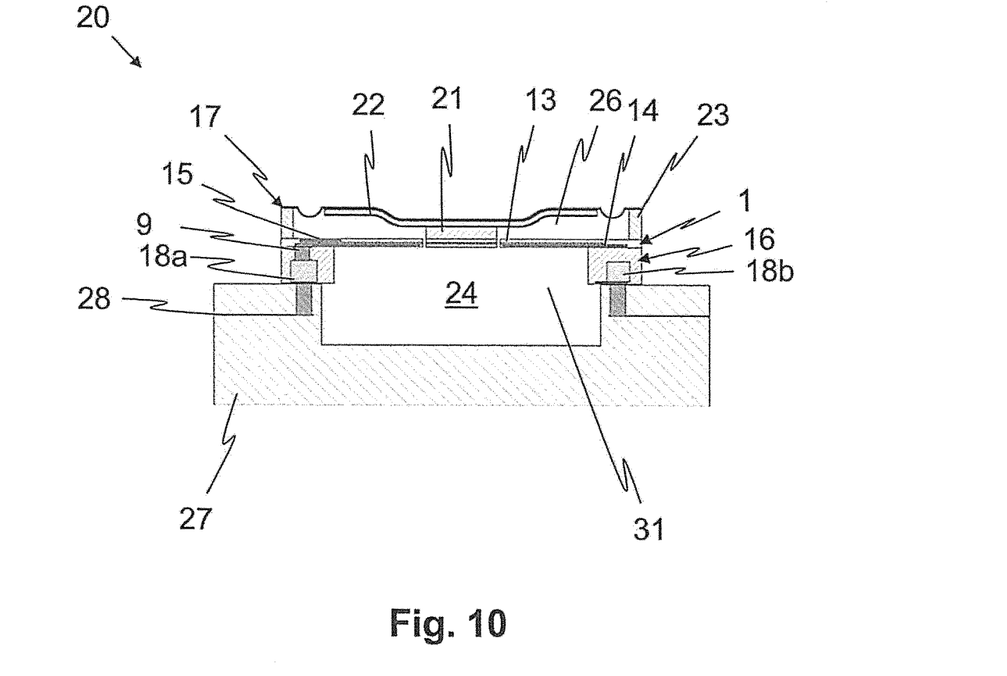

FIGS. 7, 9 and 10 show additional embodiments of the sound transducer assembly 20, whereas each essentially addresses the differences with respect to the embodiment already shown and described in FIG. 5. Thus, with the following description, the additional embodiments for the same characteristics use the same reference signs. Unless they are once again explained in detail, their design and/or mode of action corresponds to the features already described above. The differences described below can be combined with the features of the respective preceding and following embodiments.

Figure 8:
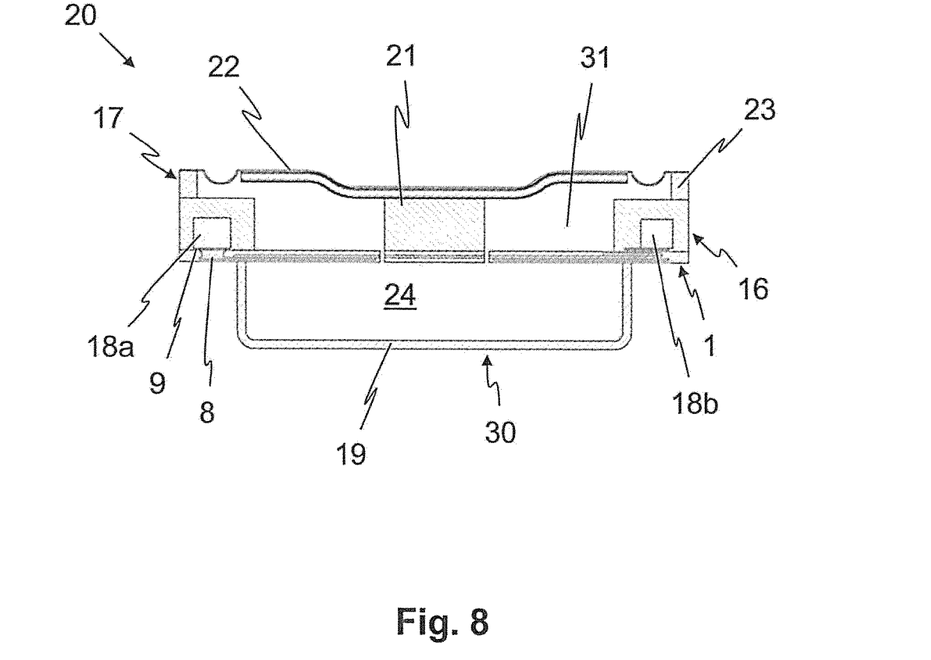

FIGS. 7 and 8 show an alternative sound transducer assembly 20, which is formed essentially according to the embodiment described above. Thus, the housing 30 is also formed herein by the membrane frame 23, the first MEMS printed circuit board unit 1, the second printed circuit board unit 16 and the housing part 19. However, according to the present embodiment, the second printed circuit board unit 16 is arranged above the first MEMS printed circuit board unit 1. Thus, the second printed circuit board unit is arranged between the first MEMS printed circuit board unit 1 and the membrane module 17. This reduces the cavity 24 by the length of the gap 31. With this embodiment, the external contacts are formed on the MEMS printed circuit board unit 1, namely on the side turned away from rigid printed circuit board unit 16. Thus, the external electrical contacts 8 are located on the lower side.

FIG. 9 shows, in a sectional view, an additional embodiment of the sound transducer assembly 20, which features the first MEMS printed circuit board unit 1 described with reference to FIG. 2. The second printed circuit board unit 16 is located above the first MEMS printed circuit board unit 1 and thus between the membrane module 17 and the first MEMS printed circuit board unit 1. The housing 30 is formed from the membrane frame 23 and the second printed circuit board unit 16 along with the housing part 19. The electrical components 18, 18a, such as an ASIC and/or a additional passive component, are integrated in the second printed circuit board unit 16. The contact section 12 is located outside the sound transducer assembly 20 and can be moved in a variable manner by means of the kinking/bending section 11.

FIG. 10 shows a sectional view of the sound transducer assembly 20 according to an additional embodiment. The sound transducer assembly 20 features a plastic element 27, which essentially forms the housing part 19. Electrical lines 28 are located in the plastic element 27. The electrical lines 28 extend laterally outward and serve as external contact for electrically connecting the sound transducer assembly 20 with an external device (not shown in the figure).

FIG. 11 shows a sectional view of the multi-layer piezoelectric structure 3 according to a first embodiment. The structure 3 comprises two electrode layers 15 and one piezo layer 13 arranged between them. Furthermore, an insulation layer 29 is arranged between the support layer 14 and the lower electrode layer 15. The support layer 14 is electrically decoupled from the lower electrode layer 15 by means of the insulating layer 29. The support layer 14 is preferably made of a metal, in particular copper. In addition, the support layer 14 preferably features a thickness of between 2 to 50 µm.

FIG. 12 shows a sectional view of the multi-layer piezoelectric structure 3 according to an additional embodiment. Here, the structure 3 comprises an upper electrode layer 15, a support layer 14 acting as an electrode layer and a piezo layer 13 arranged between the two. Thus, the support layer 14 is electrically coupled to the piezo layer 13. The support layer 14 is preferably made of a metal, in particular copper. In addition, the support layer 14 preferably features a thickness of between 2 to 50 µm.

The embodiments of the structure 3 shown in FIGS. 11 and 12 may feature at least one additional piezoelectric layer in an embodiment that is not shown here. This is preferably also arranged between two electrode layers allocated to it. Accordingly, the structure 3 would comprise two piezo layers 13. At this, one of the electrode layers 15 (in particular, one of the four electrode layers 15) may be formed by the support layer 14. The support layer 14 is preferably made of a metal, in particular copper. If the structure 3 features multiple piezoelectric layers 13, then the structure 3 can generate more force and bring about greater deflection. In this connection, it is also advantageous if the structure 3 features more than two such piezo layers 13.

This invention is not limited to the illustrated and described embodiments. Variations within the scope of the claims, just as the combination of characteristics, are possible, even if they are illustrated and described in different embodiments.

LIST OF REFERENCE SIGNS

1 MEMS printed circuit board unit
2 Circuit board
3 Multi-layer piezoelectric structure
4 Flexible connecting element
5 Fastening section
6 Woven contact paths
7 First slot
8 External contact
9 Electrical contact
10 Main section
11 Kinking/bending section
12 Contact section
13 Piezo layer
14 Support layer
15 Electrode layer
16 Second printed circuit board unit
17 Membrane module
18 Electronic component
19 Housing part
20 Sound transducer assembly
21 Coupling element
22 Membrane
23 Membrane frame
24 Cavity
25 First opening of the gap
26 Second opening of the gap
27 Plastic element
28 Electrical lines
29 Insulation layer
30 Housing
31 Gap
32 Anchor section
33 Second slot
34 Third slot
35 Fourth slot

The invention claimed is:

1. MEMS printed circuit board unit for a sound transducer assembly having a membrane configured for being set into oscillation for generating and/or detecting sound waves in the audible wavelength spectrum, comprising:
   a flexible printed circuit board; and
   a multi-layer piezoelectric structure, which is configured for setting the membrane into oscillation and/or detecting oscillations of the membrane, the multi-layer piezoelectric structure being embedded in the flexible printed circuit board; and
   wherein the flexible printed circuit board defines a slot adjacent the multi-layer piezoelectric structure so as to permit relative movement between the flexible printed circuit board and the multi-layer piezoelectric structure.

2. MEMS printed circuit board unit according to claim 1, further comprising:
   a flexible connecting element encapsulated within the flexible printed circuit board;
   an external contact;
   wherein the printed circuit board unit defines a main section that includes the multi-layer piezoelectric structure, a contact section in which the external contact is disposed and forms part of an exterior surface of the flexible printed circuit board, and a kinking/bending section disposed between the contact section and the multi-layer piezoelectric structure; and
   wherein the elasticity of the kinking/bending section permits bending up to 90° between the contact section and the main section where the multi-layer piezoelectric structure is embedded.

3. MEMS printed circuit board unit according to claim 2, wherein the elasticity of the kinking/bending section is greater than the elasticity of the contact section, and wherein the elasticity of the kinking/bending section is greater than the elasticity of the main section where the multi-layer piezoelectric structure is embedded.

4. MEMS printed circuit board unit for a sound transducer assembly having a membrane configured for being set into oscillation for generating and/or detecting sound waves in the audible wavelength spectrum, comprising:
   a flexible printed circuit board; and
   a multi-layer piezoelectric structure, which is configured for setting the membrane Into oscillation and/or detecting oscillations of the membrane, the multi-layer piezoelectric structure being embedded in the flexible printed circuit board; and
   wherein the flexible printed circuit board defines a main section that includes the multi-layer piezoelectric structure, wherein the printed circuit board unit defines a peripheral section surrounding the main section, and wherein the flexible printed circuit board defines a first slot that is disposed between and separates the main section from the peripheral section.

5. MEMS printed circuit board unit according to claim 4, wherein the flexible printed circuit board defines an anchor section by which the multi-layer piezoelectric structure can be deflected relative to the peripheral section of the flexible printed circuit board.

6. MEMS printed circuit board unit according to claim 1, further comprising a flexible connecting element, wherein the flexible printed circuit board defines a main section that includes a fastening section configured for being fastened to a coupling element, and wherein the mufti-layer piezoelectric structure is connected to the fastening section via the flexible connecting element.

7. MEMS printed circuit board unit according to claim 4, further comprising a plurality of electrically conductive leads that are embedded in the peripheral section of the printed circuit board and electrically connected to the multi-layer piezoelectric structure.

8. MEMS printed circuit board unit according to claim 7, wherein each of the plurality of electrically conductive leads is woven and made of carbon fibers or metal.

9. MEMS printed circuit board unit according to claim 1, wherein the flexible printed circuit board defines a flexible connecting element that has a free edge defining a portion of the slot that extends through the flexible printed circuit board.

10. MEMS printed circuit board unit according to claim 1, wherein the flexible printed circuit board defines a fastening section configured for being fastened to a coupling element, wherein the fastening section has a free edge defining a portion of a slot that extends through the flexible printed circuit board.

11. MEMS printed circuit board unit according to claim 1, wherein the printed circuit board completely encapsulates the multi-layer piezoelectric structure.

12. MEMS printed circuit board unit according to claim 1, wherein the multi-layer piezoelectric structure includes a support layer made of metal.

13. MEMS printed circuit board unit according to claim 12, wherein the multi-layer piezoelectric structure includes a piezoelectric actuator layer, which is electrically coupled to the support layer, whereas the support layer forms an electrode layer.

14. MEMS printed circuit board unit according to claim 12, wherein the multi-layer piezoelectric structure includes a piezoelectric actuator layer and an insulating layer disposed between the support layer and the piezoelectric actuator layer.

15. MEMS printed circuit board unit according to claim 1, wherein the multi-layer piezoelectric structure can be deflected relative to an anchor section of the printed circuit board, and/or is connected via at least one flexible connecting element to a fastening section, which is configured for fastening to a coupling element.

16. Sound transducer assembly for generating and/or detecting sound waves in the audible wavelength spectrum, comprising:
   a membrane;
   a first MEMS printed circuit board unit that includes a flexible printed circuit board and a multi-layer piezoelectric structure, which is configured and disposed for setting the membrane into oscillation and/or detecting oscillations of the membrane, the multi-layer piezoelectric structure being embedded in the flexible printed circuit board; and
   wherein the flexible printed circuit board defines a slot adjacent the multi-layer piezoelectric structure so as to permit relative movement between the flexible printed circuit board and the multi-layer piezoelectric structure.

17. Sound transducer assembly for generating and/or detecting sound waves in the audible wavelength spectrum, comprising:
   a membrane; and
   a first MEMS printed circuit board unit that includes a sound transducer assembly having a membrane configured for being set into oscillation for generating and/or detecting sound waves in the audible wavelength spectrum: the first MEMS printed circuit board unit further including a flexible printed circuit board and a multi-layer piezoelectric structure, which is configured for setting the membrane into oscillation and/or detecting oscillations of the membrane, the multi-layer piezoelectric structure being embedded in the flexible printed circuit board; and
   a coupling element, wherein the membrane is connected through the coupling element to the flexible first MEMS printed circuit board unit.

18. Sound transducer assembly according to claim 16, further comprising a rigidly formed second printed circuit board connected to the first flexible MEMS printed circuit board unit and defining a cavity therebetween.

19. Sound transducer assembly according to claim 18, wherein the rigidly formed second printed circuit board unit includes an electronic component that is completely embedded the rigidly formed second printed circuit board unit.

20. Sound transducer assembly according to claim 18, wherein the rigidly formed second printed circuit board unit comprises a gap that at least partially defines the cavity, which comprises an opening and the first flexible MEMS printed circuit board unit is disposed at the opening of the cavity, wherein the gap extends completely through the rigidly formed second printed circuit board.

* * * * *